United States Patent
Solanki et al.

(10) Patent No.: US 11,662,941 B2
(45) Date of Patent: May 30, 2023

(54) SYSTEM AND METHOD FOR MITIGATING EFFECT OF ERASE CELLS ON ADJACENT CELLS

(71) Applicant: Western Digital Technologies, Inc., San Jose, CA (US)

(72) Inventors: Bhavadip Bipinbhai Solanki, Bangalore (IN); Dharmaraju Marenahally Krishna, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 2 days.

(21) Appl. No.: 17/211,599

(22) Filed: Mar. 24, 2021

(65) Prior Publication Data
US 2022/0113893 A1 Apr. 14, 2022

Related U.S. Application Data

(60) Provisional application No. 63/090,896, filed on Oct. 13, 2020.

(51) Int. Cl.
G06F 12/00 (2006.01)
G06F 3/06 (2006.01)
G11C 16/04 (2006.01)

(52) U.S. Cl.
CPC ............ G06F 3/0655 (2013.01); G06F 3/061 (2013.01); G06F 3/0619 (2013.01); G06F 3/0679 (2013.01); G11C 16/0483 (2013.01)

(58) Field of Classification Search
CPC ...... G06F 3/0655; G06F 3/061; G06F 3/0619; G06F 3/0679; G11C 16/0483; G11C 11/5642; G11C 16/26
USPC .................................................... 711/154
See application file for complete search history.

(56) References Cited

U.S. PATENT DOCUMENTS

| | | | |
|---|---|---|---|
| 7,530,005 B2 | 5/2009 | Satori et al. | |
| 8,274,838 B2 | 9/2012 | Dutta et al. | |
| 8,611,157 B2 | 12/2013 | Dutta | |
| 8,982,626 B2 | 3/2015 | Dong et al. | |
| 9,213,599 B2 | 12/2015 | Wu et al. | |
| 9,396,807 B2 | 7/2016 | Alhussien et al. | |
| 9,792,998 B1 | 10/2017 | Yang et al. | |
| 9,928,126 B1* | 3/2018 | Shappir | G11C 11/5642 |
| 10,284,233 B2 | 5/2019 | Bazarsky et al. | |
| 10,424,387 B1 | 9/2019 | Zhang et al. | |
| 11,177,002 B1* | 11/2021 | Pitner | G11C 16/26 |
| 2016/0179428 A1 | 6/2016 | Parker et al. | |
| 2016/0371028 A1* | 12/2016 | Berman | G11C 11/5642 |
| 2017/0269992 A1* | 9/2017 | Bandic | G06F 11/1048 |

(Continued)

*Primary Examiner* — Mardochee Chery
(74) *Attorney, Agent, or Firm* — Patterson + Sheridan, LLP; Steven H. VerSteeg

(57) ABSTRACT

Methods and systems for increasing reliability of a data storage device are disclosed. During fabrication runs of a non-volatile memory (NVM) die, such as a NAND, there may be a number of memory cells designated as erase cells. When one or more erase cells are physically adjacent to programmed memory cell, electrical effects of the erase cell may cause a bit to flip in the adjacent good memory cell. To mitigate this effect, an LDPC engine is used to generate additional parity bits for the erased bit/cells. When a host requests data from the NVM, the parity bits may be used to correct additional errors because of the erased state to programmed state bit flips.

20 Claims, 4 Drawing Sheets

(56) References Cited

U.S. PATENT DOCUMENTS

2018/0343020 A1* 11/2018 Kumar ................ G06F 11/1076
2019/0107961 A1    4/2019 Lee
2020/0104209 A1    4/2020 El Gamal et al.
2021/0406165 A1* 12/2021 Lindberg ............ G06F 13/1668

* cited by examiner

SYSTEM AND METHOD FOR MITIGATING EFFECT OF ERASE CELLS ON ADJACENT CELLS

CROSS-REFERENCE TO RELATED APPLICATIONS

This application claims benefit of U.S. Provisional Patent Application Ser. No. 63/090,896, filed Oct. 13, 2020, which is herein incorporated by reference.

BACKGROUND

Field of the Disclosure

Embodiments of the present disclosure generally relates to memory cell management, and more particularly, to mitigating the effect of erase cells on adjacent cells.

Description of the Related Art

In the production of non-volatile memory (NVM) dies, there may be a number of dies considered to have a high number of error-prone memory cells. Typically, error-prone memory cells, also called 'erase cells', are logically separated from good memory cells (i.e., memory cells that are not error-prone). Although logically separated, erase cells may electrically affect good memory cells that are physically nearby, causing data to be 'flipped' in the good memory cell. To mitigate this effect, manufacturers may seek to more ardently screen memory die, only accepting dies that have a lower relative number of erase cells. However, this additional screening lowers the yield of saleable dies and raises costs. Others seek to develop custom trim parameters for the memory die, to electrically tune the dies to mitigate the effect of the erase cell. However, developing such a trim profile requires substantial time and person-resources, potentially changing scheduled launch dates for products incorporating these die.

What is needed are systems and methods for mitigating the effect of erase cells upon adjacent cells, correcting inadvertent bit flips.

SUMMARY

The present disclosure generally relates to methods and systems for increasing reliability of a data storage device. During fabrication of a non-volatile memory (NVM) die, such as a NAND, there may be a number of faulty memory cells designated as erase cells. When one or more erase cells are physically adjacent to a good memory cell, electrical effects of the erase cell may cause a bit to flip in the adjacent good memory cell. To mitigate this effect, an LDPC (low density parity check) engine is used to generate parity bits for the data stored in the good memory cells of the NVM. When a host requests data from the NVM, the parity bits may be used to correct errors in the stored data.

In one embodiment, a data storage device includes an NVM comprising a block of memory cells, an LDPC engine, and a controller configured to perform a method for error correction. In embodiments, the method includes identifying a subset of the memory cells as erase cells, receiving the identities of the erase cells at the LDPC engine, and generating parity bits for the data stored in the block based on the identities of the erase cells.

In another embodiment, a controller for a data storage device includes an I/O to one or more memories comprising a plurality of memory cells, and a processor configured to perform a method to identify erase cells and correct reading of data stored in the plurality of memory cells. The method includes identifying fewer than all of the plurality of memory cells as erase cells, generating an ECC code for the plurality of memory cells not identified as erase cells, and generating a data ECC code for host data received from a host.

In another embodiment, a system for storing includes a memory means comprising a plurality of memory cell means, a portion of the memory cell means comprising erase cells, and a controller means configured to perform a method for mitigating an effect of the erase cells on adjacent memory cell means. In embodiments the method includes identifying one or more errors in host data stored in the plurality of memory cell means, and correcting the one or more errors with an ECC code generated based on the erase cells.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure is generally related to methods and systems for increasing the reliability of a data storage device. During fabrication runs of non-volatile memory (NVM) die, such as a NAND, there may be a number of faulty memory cells designated as erase cells. When one or more erase cells are physically adjacent to a good memory cell, the electrical effects of the erase cell may cause a bit to flip in the adjacent good memory cell. To mitigate this effect, an LDPC engine is used to generate parity bits for the good memory cells of the NVM. When a host requests data from the NVM, the parity bits may be used to correct errors in the requested data.

Figure 1:
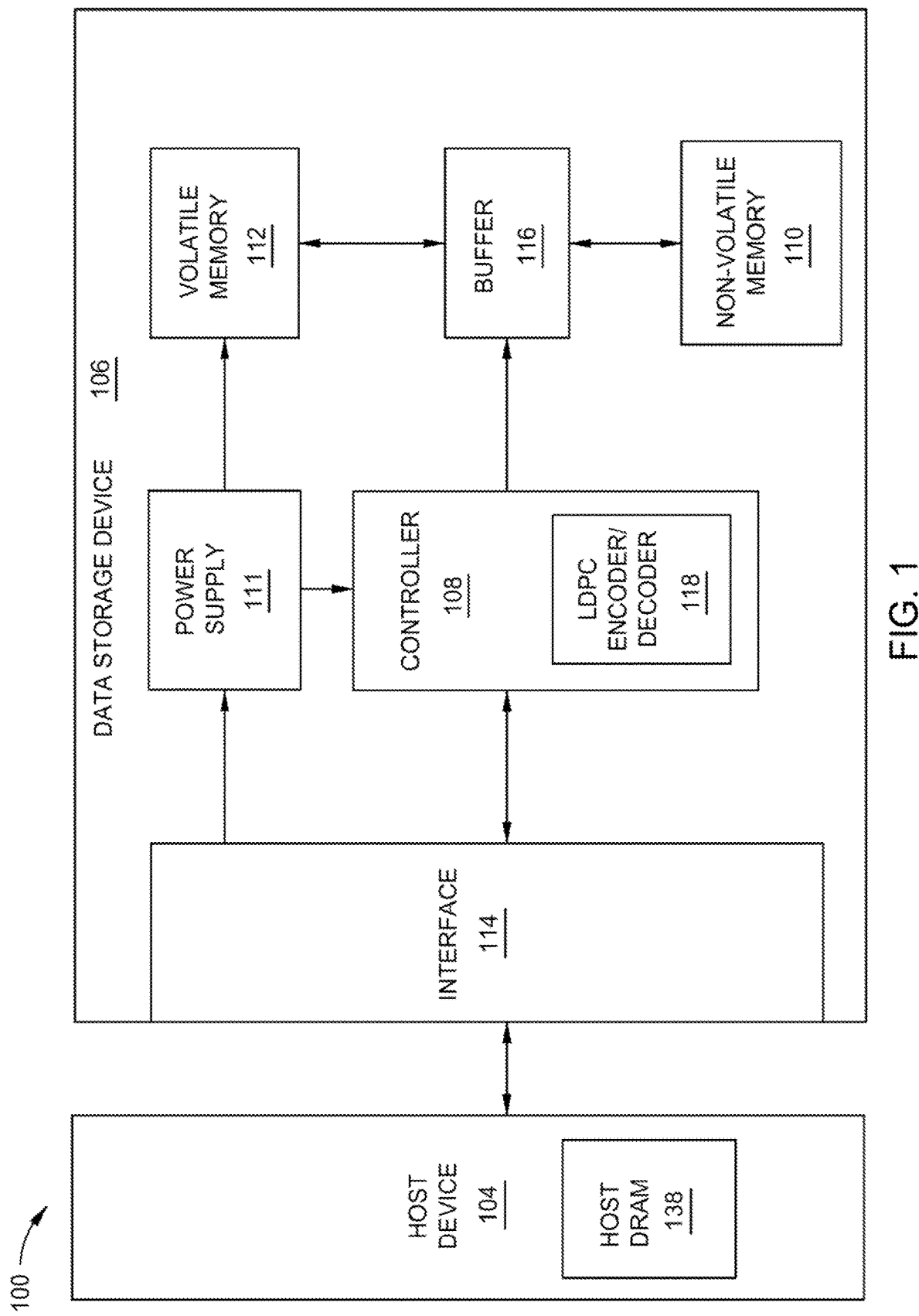
FIG. 1 is a schematic block diagram illustrating a storage system in which data storage device may function as a storage device for a host device, according to disclosed embodiments.

FIG. 1 is a schematic block diagram illustrating a storage system 100 in which data storage device 106 may function as a storage device for a host device 104, according to disclosed embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The storage system 100 includes a host device 104, which may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, an interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered) to a motherboard of the host device 104.

The interface 114 of the data storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The data storage device 106 includes a power supply 111, which may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, supercapacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The data storage device 106 also includes volatile memory 112, which may be used by controller 108 to store information. Volatile memory 112 may include one or more volatile memory devices. In some examples, the controller 108 may use volatile memory 112 as a cache. For instance, the controller 108 may store cached information in volatile memory 112 until cached information is written to non-volatile memory 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The data storage device 106 includes a controller 108, which may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the data storage device 106 receives a write command from the host device 104, the controller 108 temporarily stores the data associated with the write command in the internal memory or write buffer 116 before sending the data to the NVM 110.

The controller 108 includes a low density parity code (LDPC) encoder/decoder 118. The LDPC encoder/decoder 118 may include an internal memory to hold several matrices that include a plurality of error correction codes (ECC). The one or more matrices of the internal memory of the LDPC encoder/decoder 118 may allow for fast switching between matrices to avoid any firmware (FW) intervention or performance loss due to the time to switch between matrices.

Figure 2:
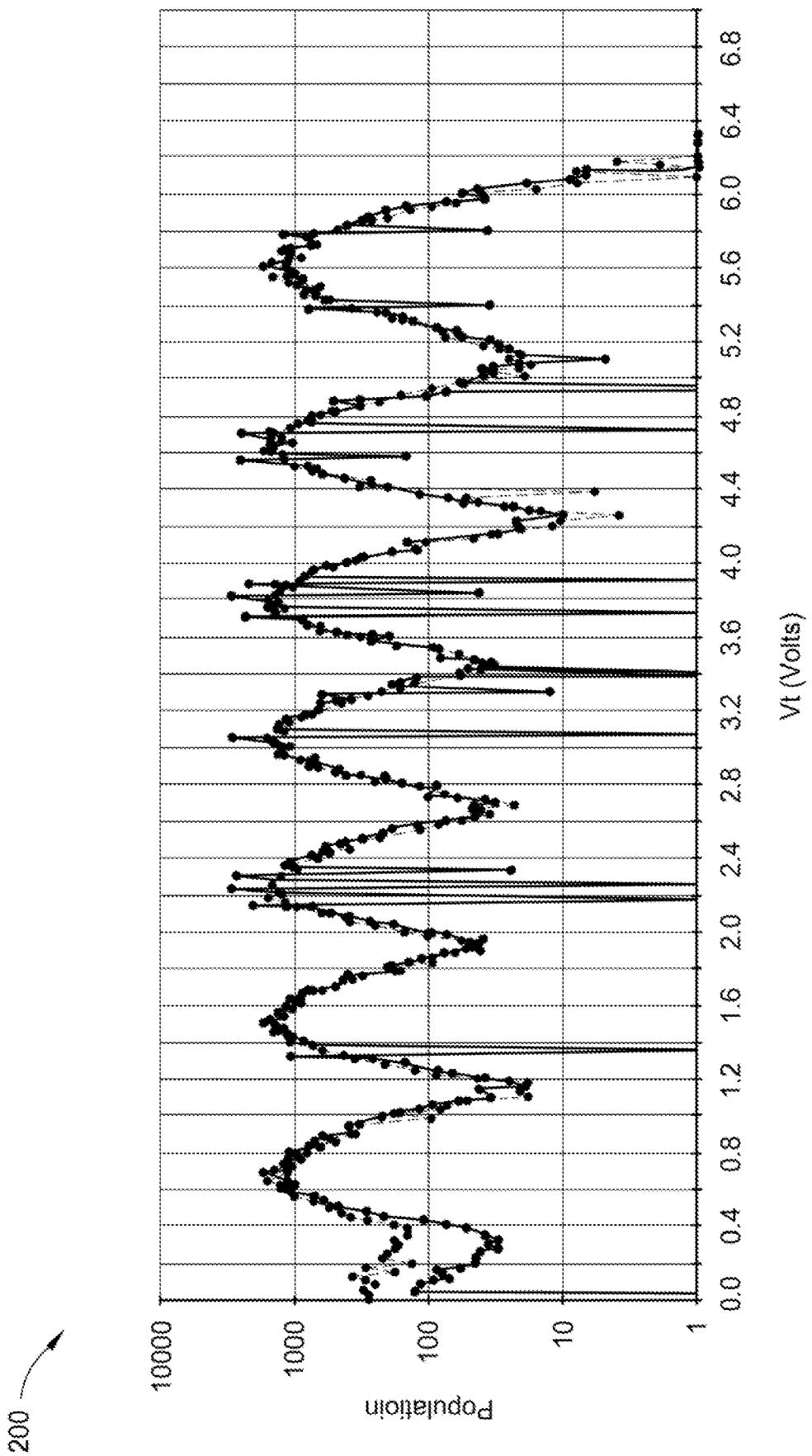
FIG. 2 is a schematic illustration of an Erase to A tail example, according to disclosed embodiments.

FIG. 2 is a schematic illustration of an Erase to A tail example, according to disclosed embodiments. The x-axis represents a voltage range in (volts), and the y-axis is a population of cells according to the various voltages in the voltage range. The resulting points on the graph illustrates a voltage state distribution. In the current illustration, seven voltage states are shown, and an erased voltage state is not shown. The erased voltage state lies on the negative x-axis. The total number of voltage states is 8, where 7 voltage states of the 8 voltage states correspond to programmed voltage states and 1 voltage state of the 8 voltage states corresponds to an erased voltage state.

Because the total number of voltage states is 8, the current embodiment describes a TLC memory cell. However, it is to be understood that the embodiments herein are applicable to other iterations of memory cells such as MLC, QLC, PLC, and the like, and that the use of a TLC memory cell in the current example is not intended to be limiting, but to provide an example of a possible embodiment. The number of voltage states that a memory cell may have may be described by the following formula: $2^n$=Number of Voltage States, where "n" represents the number of levels or memory pages, referred to as pages herein, that the memory cell has. For example, in a MLC memory cell, each cell has two levels or two pages. Therefore, the number of voltage states of a MLC memory cell is 4.

Each of the voltage states are defined by a combination of bits, where a first bit, represented by 1, refers to an erased bit and a second bit, represented by a 0, refers to a programmed bit. Each page of the cell may be either the first bit or the second bit. For example, an erased voltage state for a TLC memory has a lower page (LP) bit value of 1, a middle page (MP) bit value of 1, and an upper page (UP) bit value of 1.

Memory cells may be designated as an erase cell, such that when programming data to the NVM, such as the NVM 110 of FIG. 1, the controller, such as the controller 108 of FIG. 1, avoids programming data to the erase cell and programs the data to a memory cell that is designated as a programmable memory cell. The erase cells may be a cell that has an unacceptable bit error rate (UBER), too many program/erase (PE) cycles, a low quality memory. The memory cells designated as an erase cell may be kept as at the erased voltage state due to the controller scheduling programming around the erase cell. Furthermore, when programming data to the NVM, bit flips may occur, which may result in corrupted data. The data storage device, such as the data storage device 106 of FIG. 1, may utilize an exclusive or (XOR) engine or an LDPC engine, such as the LDPC encoder/decoder, to generate parity data to recover the corrupted data. The number of memory cells designated as erase cells may be less than the number of memory cells of the NVM.

During a write operation, data is programmed to one or more memory pages of a wordline. In the example of the TLC memory, data is programmed to at least one of the three pages of the wordline of the TLC memory. When programming to a page, the data is programmed to one of the eight voltage states. Typically, the data is programmed to the programmed voltage states. However, in some examples, data may be programmed to the erase cells rather than the programmable cells even though erase cells may be flagged or marked to be inhibited from being programmed to. However, when data is programmed to the erase cells rather than the programmable cells, the process is termed as "Erase to A tail." Programming data to the erase cell may decrease the reliability of data stored, such as increasing data corruption or the bit error rate (BER). Erase cells may affect neighboring cells through electrical influence. The electrical influence on neighboring cells may cause bit flips on the neighboring cells and decrease the data storage integrity of the neighboring cell. In order to maintain reliability of cells neighboring erase cells, the LDCP engine may generate page level ECC parity data. By keeping the page level ECC parity data, the effect of adjacent (e.g., neighboring cell) bit flips may be mitigated.

Figure 3:
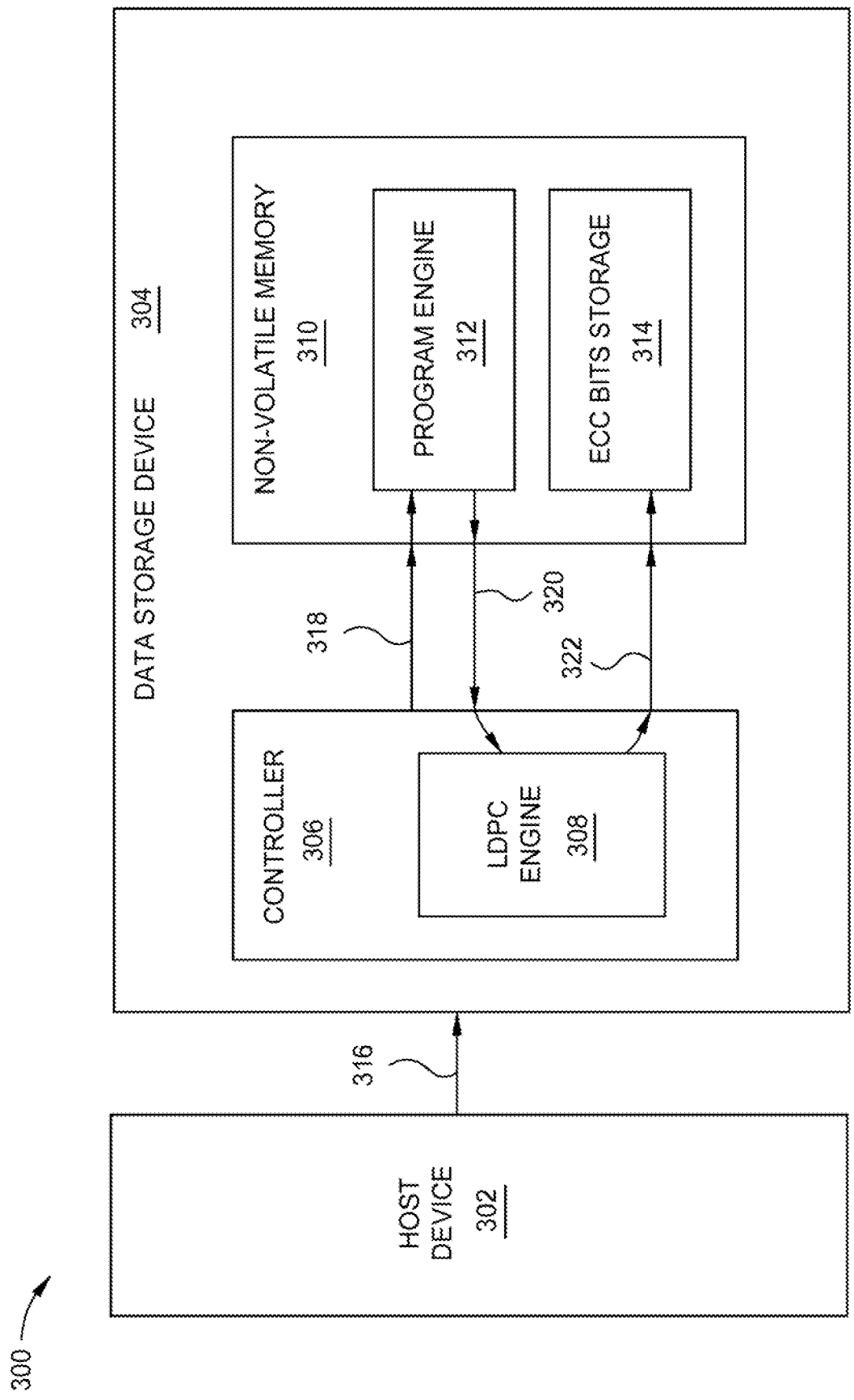
FIG. 3 is a schematic block diagram of an erase page and ECC bit generation and storage in an NVM, according to disclosed embodiments.

FIG. 3 is a schematic block diagram of a storage system 300, including an erase page and error correction code (ECC) bit generation and storage in a non-volatile memory 310, according to disclosed embodiments. Aspects of the storage system 300 may be similar to the storage system 100 of FIG. 1. For example, the host device 302 may be the host device 104, the data storage device 304 may be the data storage device 106, the controller 306 may be the controller 108, and the NVM 310 may be the NVM 110. Furthermore, the LDPC engine 308 may be the LDPC encoder/decoder 118 of FIG. 1.

The host device 302 transfers host input data via path 316 to the data storage device 304. The host input data is received by the controller 306, where the controller 306 schedules the host input data to be programmed to a block of the NVM 310. The block of the NVM 310 may be a portion of the NVM 310 that does not include erase cells. The controller 306 passes the page information for the host input data to the NVM 310 along path 318, where the page information includes which pages the host input data will be programmed to, while keeping the host input data in an internal memory, such as a cache, a buffer, or a RAM.

The host input data is received at the program engine 312. The program engine 312 may be configured to determine which memory cells are erase cells. The program engine 312 may be configured to identify a number of memory cells as erase cells based on criteria such as UBER, number of PE cycles, and the like. When storing the host input data in the NVM 310, controller 306 may schedule the data to be programmed to other cells than the erase cells. In order to determine which memory cells are erase cells, the program engine 312 may utilize the following equation: Erase Cells=LP & MP & UP, where the "&" symbol is a logical AND operation. When the LP, MP, and UP bit values are each 1, referring to erased, the resulting value is a 1 or a Boolean true value. Table 1 below illustrates an example of the erase cell determination operation.

TABLE 1

|  | Cell 0 | Cell 1 | Cell 2 | ... | ... | ... | Cell n |
|---|---|---|---|---|---|---|---|
| LP | 1 | 1 | 1 |  |  |  | 0 |
| MP | 1 | 0 | 1 |  |  |  | 1 |
| UP | 1 | 1 | 1 |  |  |  | 0 |
| Erase Cell | 1 | 0 | 1 |  |  |  | 0 |

As shown in Table 1, because all three bit values of the "Cell 0" are 1, the erase cell value is 1, where an erase cell value of 1 corresponds to an erased cell. However, in the example of "Cell 1", the MP bit value is 0, referring to a programmed bit. Because at least one bit value of the plurality of pages is 0, the erase cell value is 0. Therefore, the "Cell 1" is not an erase cell. However, if the "Cell 1" is supposed to be an erase cell, but has a MP bit flip, the LDPC parity data may be used to recover or fix the bit flip, such that the data programmed to "Cell 1" is recovered. The memory cells designated as erase cells may be masked out, by storing in a temporary latch in the NVM 310, where the temporary latch is not part of the NVM 310 program. In another example, "Cell 1" is a programmable cell. However, due to the electrical influence the neighboring erase cell, "Cell 0", has on "Cell 1", a bit flip occurs on the UP. The LDPC parity data may be used to recover or fix the bit flip, such that the data programmed to "Cell 1" is recovered.

At path 320, the program engine 312 returns the erase cell information to the LDPC engine 308, where the LDPC engine 308 generates parity bits for the host input data. The parity bits may be used to fix bit flips, such as the bit flip described above. After the LDPC engine 308 generates parity bits for the one or more pages for the host input data, the controller 306 transfers the parity bits to a designated ECC bits storage 314 in the NVM 310 along path 322. The generation of parity bits for the one or more pages may allow for greater ability to correct erase bits that migrate to a programmed bit. The ECC bits storage 314 may be a partitioned section of the NVM 310 designated to only hold ECC bits or parity bits for the erase cell information.

For example, the controller 306 schedules for the host input data to be programmed to three pages of a memory cell. However, the three pages of the memory cell are affected by the "Erase to A tail" as well as other reliability issues. When the host device 302 issues a read command to read the three pages, the data on the three pages may not be able to be read due to a plurality of bit flips. Furthermore, because of the plurality of bit flips, the LDPC engine 308 may not be able to recover the data using a default read. Therefore, the LDPC engine 308 utilizes the parity bits generated for the erase cell and the neighboring cells stored in the ECC bits storage 314 to correct the bits that are affected by the "Erase to A tail." Additional read error handling, such as additional parity bits, may be used to fix any additional bit errors. Thus, when returning the data associated with the three pages to the host, the data may be read with little to no bit errors or bit flips.

Furthermore, the LDPC engine 308 may be included as a native component of the controller or the data storage device. Rather than including an additional hardware engine for generation of parity data, such as an exclusive or (XOR) engine that may require additional RAM resources, by generating parity bits utilizing the LDPC engine 308 may decrease the power consumption of the data storage device and improve the memory storage space for storing user data. Likewise, the parity bit size of the LDPC engine 308 may be about 450 bytes for each 4 KB of data. When XOR parity bits are generated, the XOR parity bit size may be about 50% to about 100% of the total size of the associated data. Furthermore, when using the LDPC parity bits, a single extra read may be required, whereas using XOR parity bits may require a number of reads that depend on the XOR buffer size.

Figure 4:
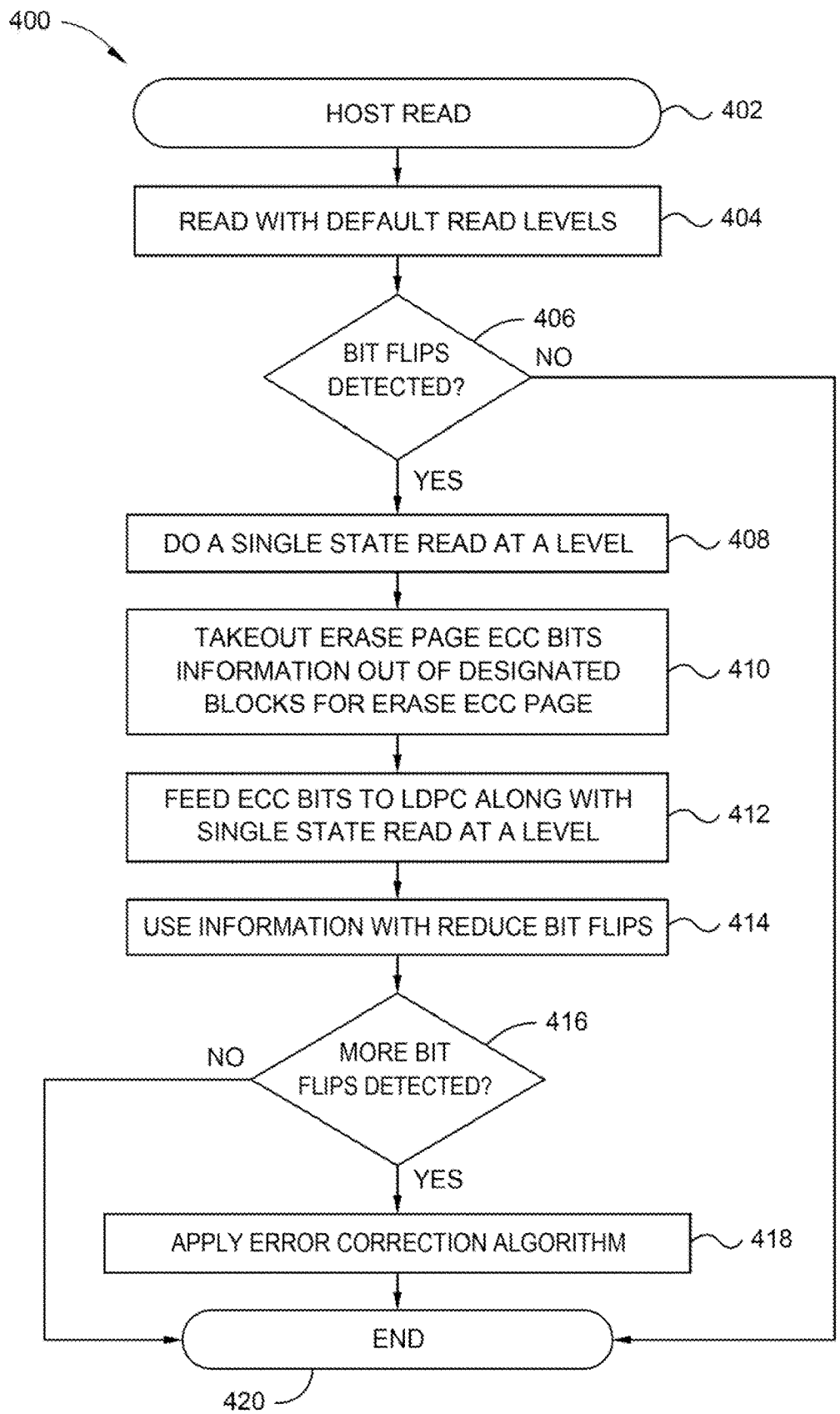
FIG. 4 is a flowchart illustrating a method of a read error handling path, according to disclosed embodiments.

FIG. 4 is a flowchart illustrating a method 400 of a read error handling path, according to disclosed embodiments. At block 402, a host, such as the host 302 of FIG. 3, read request is received by a controller, such as the controller 306 of FIG. 3. At block 404, the controller is configured to read the memory cells associated with the data of the host read request. At block 406, the controller determines if there are any bit flips in the memory cells associated with the data of the host read request. For example, a bit flip may cause an erase cell to be read as a programmable cell. If there are no bit flips detected, then the method 400 is completed at block 420.

However, if the controller detects bit flips at block 406, then the controller is configured to do a single state read at a first programmed state at block 408. For example, the single state read is executed on the memory cell with the bit flip detected to determine which bit has been flipped to an incorrect value. The memory cell with the detected bit flip may either be an erase cell or a programmable cell neighboring the erase cell. At block 410, the relevant erase page ECC bits information are transferred from the designated blocks, such as in the ECC bits storage 314 of FIG. 3, to the controller. In some examples, the ECC bits information are related to the page of the neighboring programmable cell. At block 412, the ECC bits are transferred to the LDPC engine, such as the LDPC engine 308 of FIG. 3, along with the single state read information generated at block 408.

At block 414, the LDPC engine utilizes the information at block 412 to reduce the bit flips of the data associated with the host read request. At block 416, the controller determines if there are any additional bit flips in the memory cells associated with the data of the host read request. If, at block 416, no additional bit flips are detected, then the method 400 is completed at block 420. However, if, at block 416, additional bit flips are detected, then at block 418, the controller may apply an error correction algorithm to reduce the additional detected bit flips. The reduction of bit flips may be completed using an error correction algorithm, such as a Reed-Solomon algorithm or the like. After correcting the bit flips of the memory cells associated with the data of the host read request, the method 400 is completed at block 420, and the data of the host read request is provided to the host device.

By scanning memory cells for erase cells and generating parity ECC bits for the erase cells and neighboring memory cells, the memory cells affected by the "Erase to A tail" may be remedied as well as minimize the size of data associated with data protection and integrity.

In one embodiment, a data storage device is disclosed that includes an NVM) comprising a block of memory cells, a LDPCengine, and a controller configured to perform a method for error correction. In embodiments, the method includes identifying a subset of the memory cells as erase cells, receiving the identified erase cells at the LDPC engine, and generating parity bits for the block based on the erase cells.

The method further includes receiving host data from a host and storing the host data on the block based on the identified erase cells. The method further includes using the generated parity bits to generate data parity bits based on the identified erase cells. The method further includes receiving a request for the host data and identifying a bit of the host data that has flipped to an incorrect value. The method further includes correcting the flipped bit using the data parity bits and providing the bit to the host. The identifying a memory cell as an erase cell includes obtaining a binary 1 value as a result of a logical AND operation of multiple page values of the memory cell. The storing host data on the block includes masking out erase cells.

In another embodiment, a controller for a data storage device is disclosed, that includes an I/O to one or more memories comprising a plurality of memory cells, and a processor configured to perform a method to identify erase cells and correct reading of data stored in the plurality of memory cells. The method includes identifying fewer than all of the plurality of memory cells as erase cells, generating an ECC code for the plurality of memory cells not identified as erase cells, and generating a data ECC code for host data received from a host.

The each of the plurality of memory cells are configured to store multiple memory pages. The identifying further includes, for each cell of the plurality of memory cells, combining multiple pages of the cell using a logical AND operation, resulting in a Boolean TRUE value. The multiple pages of the memory cell includes three pages. The method further includes storing the host data in the one or more memories based on the identified erase cells. The method further include receiving a read data request from the host, reading the host data from the one or more memories and identifying an error in the host data. The method further includes correcting the error using the data ECC code. The method further includes detecting an additional error in the host data and correcting the additional error with an error correction algorithm.

In another embodiment, a system for storing data is disclosed, the system including a memory means comprising a plurality of memory cell means, a portion of the memory cell means comprising erase cells, and a controller means configured to perform a method for mitigating an effect of the erase cells on adjacent memory cell means. In embodiments the method includes identifying one or more errors in host data stored in the plurality of memory cell means, and correcting the one or more errors with an ECC code generated based on the erase cells.

The method further includes determining the erase cells by combining pages within each of the memory cell means using a logical AND function. The method further includes writing host data to the plurality of memory cell means based on the erase cells. The system further including an LDPC means, and the method further includes generating the ECC code using the LDPC means and storing the ECC code in the memory means. The method further includes identifying a second error in the host data and correcting the second error with a second error correction algorithm.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
   a non-volatile memory (NVM) comprising a block of memory cells used to store data, wherein the block of memory cells comprises erase cells and programmable cells;
   a low-density parity check (LDPC) engine; and
   a controller configured to perform a method for error correction, the method comprising:
      identifying a subset of the block of memory cells as erase cells, and wherein data is programmed to the erase cells;
      receiving the identities of the erase cells at the LDPC engine;
      generating error correction code (ECC) bits for the erase cells;
      detecting a bit flip in a programmable cell; and
      using the ECC bits for the erase cells to correct the bit flip using the LDPC engine.

2. The data storage device of claim 1, the method further comprising receiving host data from a host and storing the host data in the block based on the identities of the erase cells.

3. The data storage device of claim 2, the method further comprising using the generated ECC bits to generate data parity bits based for the host data.

4. The data storage device of claim 3, the method further comprising receiving a request for the host data and identifying a bit of the host data that has flipped to an incorrect value.

5. The data storage device of claim 4, the method further comprising correcting the flipped bit using the data parity bits, and providing the corrected bit to the host.

6. The data storage device of claim 5, wherein identifying a memory cell as an erase cell comprises obtaining a binary value as a result of a predefined logical operation on multiple pages/bits of the memory cell.

7. The data storage device of claim 6, wherein storing host data in the block comprises masking out erase cells.

8. A controller for a data storage device, comprising:
an I/O to one or more memories comprising a plurality of memory cells, wherein the plurality of memory cells comprise erase cells and programmable cells; and
a processor configured to perform a method to identify erase cells and correct reading of data stored in the plurality of memory cells, the method comprising:
identifying fewer than all of the plurality of memory cells as erase cells, and wherein data is programmed to the erase cells;
generating an ECC code for the plurality of memory cells not identified as erase cells;
generating a data ECC code for host data received from a host;
detecting a bit flip in the programmable cells; and
using the ECC code for the erase cells to correct the bit flip using a LDPC engine.

9. The controller of claim 8, wherein the each of the plurality of memory cells are configured to store multiple memory pages.

10. The controller of claim 9, wherein the identifying further comprises, for each cell of the plurality of memory cells, combining multiple pages of the cell using a logical AND operation, resulting in a Boolean TRUE value.

11. The controller of claim 9, wherein the multiple pages of the memory cell comprises three pages.

12. The controller of claim 8, the method further comprising storing the host data in the one or more memories based on the identified erase cells.

13. The controller of claim 12, the method further comprising receiving a read data request from the host, reading the host data from the one or more memories and identifying an error in the host data.

14. The controller of claim 13, the method further comprising correcting the error using the data ECC code.

15. The controller of claim 13, the method further comprising detecting an additional error in the host data, and correcting the additional error with an error correction algorithm.

16. A system for storing data, comprising:
a memory means comprising a plurality of memory cell means, a portion of the memory cell means comprising erase cells and programmable cells, and wherein data is programmed to the erase cells; and
a controller means configured to perform a method for mitigating an effect of the erase cells on adjacent memory cell means, the method comprising:
identifying one or more errors in host data stored in the plurality of memory cell means;
correcting the one or more errors with an ECC code generated based on the erase cells;
detecting a bit flip in the programmable cells; and
using the ECC code for the erase cells to correct the bit flip using an LDPC means.

17. The system of claim 16, wherein the method further comprises determining the erase cells by combining pages within each of the memory cell means using a logical AND function.

18. The system of claim 17, wherein the method further comprises writing host data to the plurality of memory cell means based on the erase cells.

19. The system of claim 18, further comprising generating the ECC code using the LDPC means and storing the ECC code in the memory means.

20. The system of claim 19, wherein the method further comprises identifying a second error in the host data, and correcting the second error with a second error correction algorithm.

* * * * *